United States Patent
Matsumi et al.

(10) Patent No.: US 8,692,272 B2
(45) Date of Patent: Apr. 8, 2014

(54) RESIN COMPOSITION, REFLECTIVE BOARD AND LIGHT-EMITTING APPARATUS

(75) Inventors: Yasuo Matsumi, Tsukuba (JP); Mitsuo Maeda, Tsukuba (JP); Shintaro Saito, Tsukuba (JP)

(73) Assignee: Sumitomo Chemical Company, Limited, Tokyo (JP)

(*) Notice: Subject to any disclaimer, the term of this patent is extended or adjusted under 35 U.S.C. 154(b) by 318 days.

(21) Appl. No.: 13/125,348

(22) PCT Filed: Oct. 23, 2009

(86) PCT No.: PCT/JP2009/068640
§ 371 (c)(1),
(2), (4) Date: Apr. 21, 2011

(87) PCT Pub. No.: WO2010/050576
PCT Pub. Date: May 6, 2010

(65) Prior Publication Data
US 2011/0204406 A1  Aug. 25, 2011

(30) Foreign Application Priority Data
Oct. 28, 2008  (JP) ................................. 2008-276456

(51) Int. Cl.
*H01L 33/00* (2010.01)
(52) U.S. Cl.
USPC ................. 257/98; 257/E33.072; 252/299.01
(58) Field of Classification Search
USPC .................... 257/98, E33.072; 252/299.01
See application file for complete search history.

(56) References Cited

U.S. PATENT DOCUMENTS

| 7,713,439 | B2 * | 5/2010 | Murouchi et al. | ....... 252/299.01 |
| 2004/0165390 | A1 | 8/2004 | Sato et al. | |
| 2009/0212684 | A1 | 8/2009 | Saito et al. | |
| 2009/0250662 | A1 | 10/2009 | Murouchi et al. | |
| 2010/0051999 | A1 | 3/2010 | Iwase et al. | |
| 2010/0060134 | A1 | 3/2010 | Saito et al. | |
| 2011/0089371 | A1 | 4/2011 | Murouchi et al. | |

FOREIGN PATENT DOCUMENTS

| JP | 62-179780 A | 8/1987 |
| JP | 03-265650 A | 11/1991 |
| JP | 08-302172 A | 11/1996 |
| JP | 2002-294070 A | 10/2002 |
| JP | 2003-195020 A | 7/2003 |
| JP | 2004-256673 A | 9/2004 |
| JP | 2004-277539 A | 10/2004 |
| JP | 2005-232210 A | 9/2005 |
| JP | 2007-218980 A | 8/2007 |
| JP | 2007-254669 A | 10/2007 |
| JP | 2007-320996 A | 12/2007 |
| JP | 2008-231368 A | 10/2008 |
| JP | 2009-256627 A | 11/2009 |
| WO | 0202717 A2 | 1/2002 |
| WO | 2009119863 A1 | 10/2009 |

OTHER PUBLICATIONS

Int'l Search Report issued Dec. 1, 2009 in Int'l Application No. PCT/JP2009/068640.

* cited by examiner

*Primary Examiner* — Minh-Loan T Tran
(74) *Attorney, Agent, or Firm* — Panitch Schwarze Belisario & Nadel LLP

(57) ABSTRACT

The present invention provides a resin composition comprising a liquid crystal polyester and a titanium oxide filler, wherein when a value obtained by converting the content of aluminum in the titanium oxide filler to the content of aluminum oxide is A (% by weight) and the volume average particle diameter of the titanium oxide filler is B (μm), A and B satisfy the formula (I): $A \geq 0.1$ and the formula (II): $A/B^2 \leq 25$, a reflective board obtained by molding the resin composition, and a light-emitting apparatus comprising the reflective board and a light-emitting element. According to the resin composition of the present invention, a reflective board having high reflectance and high heat resistance can be obtained. Furthermore, a light-emitting apparatus which is excellent in properties such as luminance can be obtained by using the reflective board.

9 Claims, No Drawings

RESIN COMPOSITION, REFLECTIVE BOARD AND LIGHT-EMITTING APPARATUS

CROSS-REFERENCE TO RELSTED APPLICATION

This application is a Section 371 of International Application No. PCT/JP2009/068640, filed Oct. 23, 2009, which was published in the Japanese language on May 6, 2010, under International Publication No. WO 2010/050576 A1, and the disclosure of which is incorporated herein by reference.

TECHNICAL FIELD

The present invention relates to a resin composition which is useful as a material for reflective boards, a reflective board which is obtained by using the resin composition, and a light-emitting apparatus comprising the reflective board.

BACKGROUND ART

Many reflective boards formed of resins are used for LED (light-emitting diode) light-emitting apparatuses in view of processing property and light weight property. In the preparation of such LED light-emitting apparatuses, a reflective board is sometimes exposed to an environment under a high temperature in a step of mounting an LED element, a step of curing a sealing resin, a step of soldering during assembling an LED module, and the like. Therefore, high heat resistance is required for a resin material which constitutes a reflective board. Furthermore, excellent moldability is also required for the preparation of a reflective board. Therefore, liquid crystal polymers, specifically liquid crystal polyesters are widely considered for the resin material.

Furthermore, high reflectance is required for reflective boards so as to improve the luminance of light-emitting apparatuses. Therefore, as a resin material for reflective boards, a resin composition comprising a filler which can impart high reflectance to reflective boards and a liquid crystal polymer is considered. For example, Japanese Published Examined Patent Application No. 6-38520 and Japanese Published Unexamined Patent Application No. 2007-254669 disclose resin compositions comprising a liquid crystal polyester and a titanium oxide filler as resin materials for reflective boards.

DISCLOSURE OF THE INVENTION

However, in conventional resin compositions comprising a liquid crystal polyester and a titanium oxide filler, the titanium oxide filler does not necessarily have sufficient dispersing property in the liquid crystal polyester, and thus the reflectance of the obtained reflective board may decrease. Furthermore, when the liquid crystal polyester and the titanium oxide filler are contacted under a high temperature during the preparation or formation of the composition, if the period for the contact is relatively long, decomposition of the liquid crystal polyester to lower molecules is sometimes induced. Therefore, when one attempts to connect other element to the obtained reflective board by soldering, abnormal appearance such as bulging sometimes occurs, probably due to vaporization of the produced decomposed lower molecular weight components, and the like.

Therefore, the object of the present invention is to provide a resin composition which is preferable as a material for a reflective board having high reflectance, and high heat resistance which is sufficient to prevent occurrence of abnormal appearance even treated under a high temperature, a reflective board comprising the resin composition, and a light-emitting apparatus comprising the reflective board.

The present inventors have done intensive studies, and consequently completed the present invention and achieved the above-mentioned object. Namely, the present invention provides a resin composition comprising a liquid crystal polyester and a titanium oxide filler, wherein when a value obtained by converting the content of aluminum in the titanium oxide filler to the content of aluminum oxide is A % by weight and the volume average particle diameter of the titanium oxide filler is B μm, A and B satisfy the following formulas (I) and (II):

$$A \geq 0.1 \tag{I}$$

$$A/B^2 \leq 25 \tag{II}$$

Furthermore, the present invention provides a reflective board obtained by molding the above-mentioned resin composition and a light-emitting apparatus comprising the reflective board and a light-emitting element.

According to the resin composition of the present invention, a reflective board having high reflectance and high heat resistance can be obtained. Furthermore, it is quite industrially useful to use the reflective board since a light-emitting apparatus which is excellent in properties such as luminance.

EMBODIMENT FOR CARRYING OUT THE INVENTION

The resin composition of the present invention comprises a liquid crystal polyester and a titanium oxide filler.

<Liquid Crystal Polyester>

The liquid crystal polyester used in the present invention is a polyester called as a thermotropic liquid crystal polymer, which forms a melt which shows optical anisotropy at 450° C. or less. Examples of such liquid crystal polyester may include the followings.

(1): those obtained by combining and polymerizing an aromatic hydroxycarboxylic acid, an aromatic dicarboxylic acid and an aromatic diol.

(2): those obtained by polymerizing plural kinds of aromatic hydroxycarboxylic acids.

(3): those obtained by combining and polymerizing an aromatic dicarboxylic acid and an aromatic diol.

(4): those obtained by reacting a crystalline polyester such as polyethylene telephthalate with an aromatic hydroxycarboxylic acid.

It is also possible to use, instead of the aromatic hydroxycarboxylic acid, aromatic dicarboxylic acid or aromatic diol, ester-forming derivatives thereof in the preparation of the liquid crystal polyester. Use of such ester-forming derivatives is advantageous in that a liquid crystal polyester is prepared more easily.

The ester-forming derivative is explained briefly. Examples of ester-forming derivatives of an aromatic hydroxycarboxylic acid and an aromatic dicarboxylic acid having carboxyl groups in a molecule may include those in which the carboxyl groups have been converted to highly reactive groups such as haloformyl groups and acyloxycarbonyl groups, and those in which the carboxyl groups have formed esters with alcohols or ethylene glycol so as to form a polyester by a transesterification reaction. Examples of the ester-forming derivatives of an aromatic hydroxycarboxylic acid and an aromatic diol having phenolic hydroxy groups in a molecule may include those in which the phenolic hydroxy groups have formed esters with lower carboxylic acids so as to form a polyester by a transesterification reaction.

Furthermore, as long as the ester-forming property is not inhibited, the aromatic hydroxycarboxylic acid, aromatic dicarboxylic acid or aromatic diol may have halogen atoms such as a chlorine atom and a fluorine atom; alkyl groups having 1 to 10 carbons such as a methyl group and an ethyl group; aryl groups having 6 to 10 carbons such as a phenyl group as substituents on the aromatic ring thereof.

As the structural unit which constitutes the liquid crystal polyester, the followings are exemplified. Structural units derived from an aromatic hydroxycarboxylic acid:

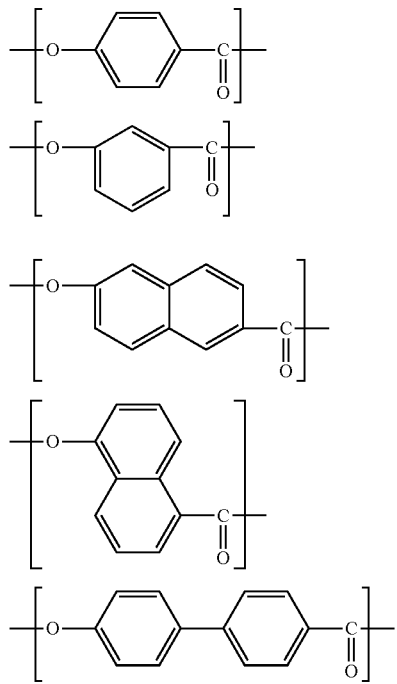

The above-mentioned structural unit may have a halogen atom, an alkyl group or an aryl group as substituents. Structural units derived from an aromatic dicarboxylic acid:

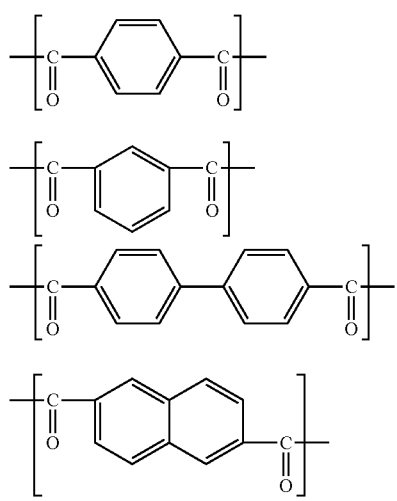

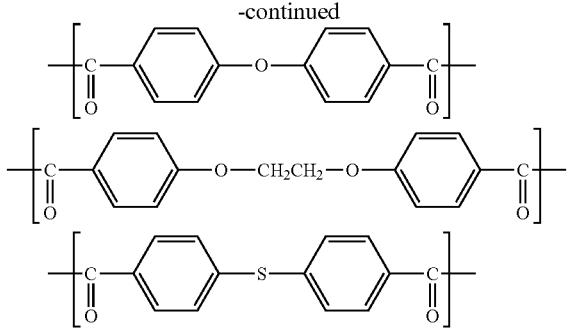

The above-mentioned structural unit may have a halogen atom, an alkyl group or an aryl group as substituents. Structural units derived from an aromatic diol:

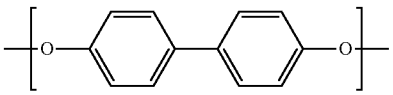

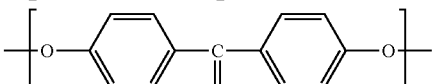

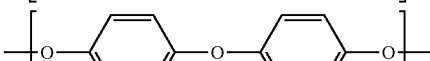

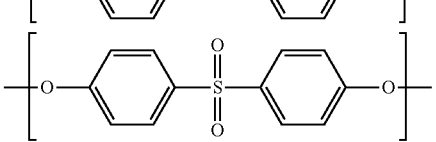

The above-mentioned structural unit may have a halogen atom, an alkyl group or an aryl group as substituents.

Examples of preferable liquid crystal polyesters may include liquid crystal polyesters in which the combination of the structural units is any of the following (a) to (h).

(a): A combination consisting of ($A_1$), ($B_1$) and ($C_1$), or a combination consisting of ($A_1$), ($B_1$), ($B_2$) and ($C_1$).

(b): A combination consisting of ($A_2$), ($B_3$) and ($C_2$), or a combination consisting of ($A_2$), ($B_1$), ($B_3$) and ($C_2$).

(c): A combination consisting of ($A_1$) and ($A_2$).

(d): The combinations of the structural units of (a) in which a part or whole of ($A_1$) has been replaced with ($A_2$).

(e): The combinations of the structural units of (a) in which a part or whole of ($B_1$) has been replaced with ($B_3$).

(f): The combinations of the structural units of (a) in which a part or whole of ($C_1$) has been replaced with ($C_3$).

(g): The combinations of the structural units of (b) in which a part or whole of ($A_2$) has been replaced with ($A_1$).

(h): The combinations of the structural units of (c) to which ($B_1$) and ($C_2$) have been added.

As in the above-mentioned (a) to (h), as the liquid crystal polyester used in the present invention, those having ($A_1$) and/or ($A_2$) as the structural unit derived from an aromatic hydroxycarboxylic acid, one or more selected from ($B_1$), ($B_2$) and ($B_3$) as the structural unit derived from an aromatic diol, and one or more selected from ($C_1$), ($C_2$) and ($C_3$) as the structural unit derived from an aromatic dicarboxylic acid are preferable. As mentioned above, these structural units may have substituents on the aromatic ring. However, when the reflective board is required to have higher heat resistance, it is desirable that the structural units have no substituent.

The liquid crystal polyester used in the present invention has a flow temperature of, preferably in the range of 270 to 400° C., more preferably in the range of 300 to 380° C. When a liquid crystal polyester having a flow temperature in this range is used, a reflective board is prepared more easily, and when the reflective board is used for, for example a light-emitting apparatus using an LED as a light-emitting element, inconvenience that the reflective board is deformed or the reflective board is colored to decrease reflectance under high temperature circumstance such as that in a step of assembling an LED module can be prevented finely.

The flow temperature as used herein is a temperature at which a melting viscosity is 4800 Pa·sec when a heated melt is ejected from a nozzle by using a capillary rheometer with a nozzle having an inner diameter of 1 mm and a length of 10 mm under a loading of 9.8 MPa at a temperature raising velocity of 4° C./min, and the flow temperature is an index for showing a molecular weight of a liquid crystal polyester, which is well-known in the art (see Naoyuki Koide ed., "SYNTHESIS, FORMING AND APPLICATION OF LIQUID CRYSTALLINE POLYMERS", pages 95 to 105, CMC, published on Jun. 5, 1987).

As the method for preparing the liquid crystal polyester, various known methods can be adopted, and the method for preparing a liquid crystal polyester as suggested by the applicant of the present application in Japanese Published Unexamined Patent Application No. 2004-256673 is preferable. Hereinafter the preferable method for preparing a liquid crystal polyester suggested in this publication is explained with referring to an example.

An aliphatic acid anhydride is mixed with a mixture of an aromatic hydroxycarboxylic acid, an aromatic diol and an aromatic dicarboxylic acid, and the mixture is reacted under a nitrogen atmosphere at 130 to 180° C. to acylate the phenolic hydroxy groups of the aromatic hydroxycarboxylic acid and the aromatic diol with the aliphatic acid anhydride to give an acylated product (an acylated product of the aromatic hydroxycarboxylic acid and an acylated product of the aromatic diol). The temperature is then further raised while reaction by-products are distilled off out of the reaction system so that the acyl groups of the acylated product and the carboxyl groups of the acylated product of the aromatic hydroxycarboxylic acid and those of the aromatic dicarboxylic acid can be transesterified, whereby polycondensation is performed to produce a liquid crystal polyester.

In the mixture of the aromatic hydroxycarboxylic acid, aromatic diol and aromatic dicarboxylic acid, the molar ratio of the carboxyl groups to the phenolic hydroxy groups is preferably in the range of 0.9 to 1.1.

The used amount of the aliphatic acid anhydride with respect to the total phenolic hydroxy groups of the aromatic diol and aromatic hydroxycarboxylic acid is preferably 0.95 to 1.2 molar-fold, more preferably 1.00 to 1.15 molar-fold. When the used amount of the aliphatic acid anhydride is small, coloring of the obtained liquid crystal polyester tends to be suppressed; however, when the used amount of the aliphatic acid anhydride is too small, the unreacted aromatic diol or aromatic dicarboxylic acid sublimate easily during polycondensation, whereby the reaction system may be occluded. On the other hand, when the used amount of the aliphatic acid anhydride is too much, coloring of the obtained liquid crystal polyester may occur, whereby the reflectance of the obtained reflective board may be deteriorated. From these viewpoints, it is preferable that the used amount of the aliphatic acid anhydride is within the above-mentioned range.

Examples of the aliphatic acid anhydride may include, but are not limited to, acetic anhydride, propionic anhydride, butyric anhydride, isobutyric anhydride, valeric anhydride, pivalic anhydride, 2-ethylhexanoic anhydride, monochloroacetic anhydride, dichloroacetic anhydride, trichloroacetic anhydride, monobromoacetic anhydride, dibromoacetic anhydride, tribromoacetic anhydride, monofluoroacetic anhydride, difluoroacetic anhydride, trifluoroacetic anhydride, glutaric anhydride, maleic anhydride, succinic anhydride and β-bromopropionic anhydride. These may be used as a mixture of two or more kinds. In view of economic efficiency and handling property, acetic anhydride, propionic anhydride, butyric anhydride and isobutyric anhydride are used preferably, and acetic anhydride is used more preferably.

The transesterification (polycondensation) reaction is performed preferably while raising the temperature at a ratio of 0.1 to 50° C./min in the range of 130 to 400° C., and more preferably while raising the temperature at a ratio of 0.3 to 5° C./rain in the range of 150 to 350° C. Furthermore, in order to perform the transesterification (polycondensation) reaction more smoothly, the reaction by-products are distilled off out of the system.

It is preferable that the transesterification (polycondensation) reaction is performed in the presence of a heterocyclic organic base compound having two or more nitrogen atoms from the viewpoints of preparing the liquid crystal polyester more smoothly and sufficiently suppressing coloring of the obtained liquid crystal polyester. Examples of the heterocyclic organic base compound having two or more nitrogen atoms (nitrogen-containing heterocyclic organic base compound) may include imidazole compounds, triazole compounds, dipyridyl compounds, phenanthroline compounds and diazaphenanthrene compounds. Among these, imidazole compounds are preferably used in view of reactivity during polycondensation, and 1-methylimidazole and 1-ethylimidazol are more preferably used since they are readily available.

Furthermore, for the purpose of increasing a polycondensation velocity by further accelerating the transesterification (polycondensation) reaction, a catalyst other than the nitrogen-containing heterocyclic organic base compound may also be used to the extent that the purpose of the present invention is not deteriorated. However, when a metal salt is used as a catalyst, the metal salt remains in the liquid crystal polyester as an impurity and may adversely affect electronic parts such as reflective boards. Also from this viewpoint, use of the nitrogen-containing heterocyclic organic base compound is a specifically preferable embodiment for the preparation of the liquid crystal polyester.

Examples of the method for further promoting the transesterification (polycondensation) reaction to further increase the polymerization degree of the liquid crystal polyester may include a method comprising reducing the pressure in a reaction vessel for the transesterification (polycondensation) reaction (polymerization under reduced pressure), a method comprising solidifying the reaction product after the transesterification (polycondensation) reaction by cooling, pulverizing the product to give a powder, and heat-treating the obtained powder at 250 to 350° C. for 2 to 20 hours (solid phase polymerization), and the like. By increasing the polymerization degree by such methods, a liquid crystal polyester having a preferable flow temperature is produced easily. In view of convenience of facilities, it is preferable to use solid phase polymerization.

It is preferable that the above-mentioned acylation and transesterification (polycondensation) reaction, and polymerization under reduced pressure and solid phase polymerization which aim at improving a polymerization degree are performed in an atmosphere of inert gas such as nitrogen so as to sufficiently prevent coloring of the liquid crystal polyester.

The thus-prepared liquid crystal polyester generally has a YI value of 32 or less, and is specifically preferable as the liquid crystal polyester used in the present invention. The YI value is an index for showing a yellow index of an object, and is a value as defined by the following formula. The value can be measured according to ASTM D1925 by using a colorimeter for a test piece formed of the liquid crystal polyester:

$$YI=[100(1.28X-1.06Z)/Y]$$

wherein X, Y and Z are tristimulus values of light source colors in an XYZ color system.

Although the liquid crystal polyester which is obtained by the preparation method using the nitrogen-containing heterocyclic organic base compound as a catalyst and has a YI value of 32 or less is specifically preferable, a mixture of liquid crystal polyesters in which the YI value has been adjusted to 32 or less by mixing plural kinds of liquid crystal polyesters can also be used. Also in this case, a preferable mixture of the liquid crystal polyesters can be selected by obtaining the YI value of the mixture of the liquid crystal polyesters by the method as mentioned above.

<Titanium Oxide Filler>

The titanium oxide filler used in the present invention comprises a metal aluminum and/or an aluminum compound (hereinafter the metal aluminum and aluminum compound are sometimes collectively referred to as "aluminum component") in addition to titanium oxide, and one obtained by coating the surface of titanium oxide with the aluminum component is preferable. The titanium oxide used for such titanium oxide filler is referred to as "titanium oxide" in the art, and those commercially available as a filler for filling resins can be used.

The crystalline form of the titanium oxide is not specifically limited, and may be a rutile-type, an anatase-type or a mixture of both types. In view of light reflection performance and weather resistance, a titanium oxide comprising a rutile-type titanium oxide is preferable, and it is more preferable to use a titanium oxide in which substantially the whole titanium oxide is a rutile-type titanium oxide.

The method for the preparation of the titanium oxide used for the titanium oxide filler is not specifically limited, and a sulfuric acid method in which sulfuric acid is reacted by using ilmenite as a raw material, a chlorine method in which chlorine gas is reacted by using a rutile ore as a raw material, and the like can be used. Of these, the titanium oxide produced by the chlorine method tends to have finer reflectance and solder heat resistant temperature than those of the titanium oxide produced by the sulfuric acid method since it has quite low contents of colorable metal material impurities such as iron, chromium and vanadium, and is preferable for use as the titanium oxide in the present invention.

Alternatively, titanium oxide obtained by adding an aqueous solution of aluminum sulfate to metatitanic acid obtained by hydrolyzing titanyl sulfate, sufficiently kneading and roasting the mixture can be used as the titanium oxide filler.

A preferable titanium oxide filler used in the present invention is one obtained by surface treatment of titanium oxide with an aluminum compound, preferably with aluminum oxide. Alternatively, as the titanium oxide filler, one obtained by surface treatment of titanium oxide with aluminum oxide and silica (silicon oxide), and one obtained by surface treatment of titanium oxide with aluminum oxide, silica and zirconia (zirconium oxide) can also be used. Alternatively, a mixture of the titanium oxide filler, obtained by surface treatment of titanium oxide with aluminum oxide and titanium oxide of which surface is not treated with aluminum oxide can also be used as the titanium oxide filler.

A typical method for preparing the titanium oxide filler by surface treatment of titanium oxide is explained. Examples of such method for preparing the titanium oxide filler may include a method comprising dispersing titanium oxide and a surface treating agent comprising an aluminum compound in water or an organic solvent to perform a wet treatment, and a method comprising dry-treating titanium oxide and a surface treating agent comprising an aluminum compound in a super mixer, a Henschel mixer or the like. Of these, the former method for wet treatment is preferable. The reason is that the surface of the titanium oxide in the obtained titanium oxide filler is surface-treated with the aluminum compound more uniformly. The aluminum compound as used herein is generally an aluminate salt or an aluminum salt, and examples of such aluminate salt or aluminum salt may include sodium aluminate, aluminum sulfate, aluminum nitrate, aluminum chloride and the like. In addition, in order to obtain the surface treatment layer of titanium oxide comprising silica or zirconia in addition to aluminum oxide, sodium silicate, potassium silicate, silicon tetrachloride, zirconium sulfate, zirconium chloride and the like may be used in combination with the aluminate salt or aluminum salt.

An example of the wet treatment is exemplified and further explained in detail. An aqueous slurry comprising titanium oxide is first prepared, and the surface treating agent as mentioned above is added to the aqueous slurry, and then the pH is adjusted to about 6 to 7 with an acid or alkali, whereby the surface of the titanium oxide is coated with the surface treating agent. The aqueous slurry is then filtered by using a filter press, a drum filter or the like, and further washed to rinse-off the residual surface treating agent. The slurry is then dried by using a band dryer, a spray dryer or the like, and baked by using an electric furnace, a rotary baking furnace or the like. After the baking, pulverization and the like are suitably performed, whereby the titanium oxide filler is prepared.

In the titanium oxide filler used in the present invention, when the value obtained by converting the content of aluminum in the titanium oxide filler to the content of aluminum oxide is A % by weight and the volume average particle diameter of the titanium oxide filler is B μm, A and B satisfy the following formulas (I) and (II):

$$A \geq 0.1 \quad (I)$$

$$A/B^2 \leq 25 \quad (II).$$

In other words, the A in the above-mentioned formulas (I) and (II) is the content of aluminum oxide (unit: % by weight) when the whole aluminum component included in the titanium oxide filler is considered as aluminum oxide. A is preferably 0.2 or more, more preferably 0.3 or more. When A is lower than 0.1, the dispersion property of the titanium oxide filler in the liquid crystal polyester tends to decrease, whereby the reflectance of the obtained reflective board tends to decrease.

Furthermore, the $A/B^2$ in the above-mentioned formula (II) is a concept which shows the amount of the aluminum component present on the surface with respect to the whole surface area of the titanium oxide filler, and the unit thereof is "% by weight" per $\mu m^2$ (namely, wt $\%/\mu m^2$). The aluminum component included in the titanium oxide filler is present not only on the surface of the titanium oxide filler but also is present in the inner portion of the titanium oxide filler. However, the present inventors have found that the properties such as the reflectance and solder heat resistant temperature of the obtained reflective board tend to be deteriorated in the titanium oxide filler having much aluminum component on the surface. Therefore, even in the case when the aluminum component is present in the inner portion of the titanium oxide filler, if $A/B^2$ is 25 or less assuming that the aluminum component is eccentrically-located on the surface of the titanium oxide filler, the titanium oxide filler can be used in the present invention as the titanium oxide filler. $A/B^2$ is preferably 20 or less, and 2 or more, more preferably 3 or more.

The method for obtaining the aluminum oxide content-conversion value A of the aluminum content in the titanium oxide filler is explained. In order to obtain the aluminum oxide content-conversion value A, about 0.05 g to 0.1 g of the titanium oxide filler is weighed accurately first and put into a platinum dish. Then, 1 g of sodium carbonate and 0.5 g of boric acid are added, and the platinum dish is heated with a burner or the like to melt the content therein. It is sufficient to confirm the melting by visually confirming that the content on the dish has been melted. 10 ml of hydrochloric acid is added to the cooled melted product to dissolve, and the solution is further put into a measuring flask of 50 ml and the volume is measured with water. The thus-obtained solution for measurement is analyzed by using ICP-AES (plasma emission spectrometry). During the analysis, the solution for measurement may be further diluted with water so as to be within the range which can be analyzed by ICP-AES. The amount of aluminum included in the titanium oxide filler (% by weight) is obtained from the analysis value of aluminum obtained as above using ICP-AES and the weight of the titanium oxide filler subjected to melting, and the value is multiplied with [101.96 (the formula weight of aluminum oxide $Al_2O_3$)/26.98 (the atomic weight of aluminum Al)/2]=[1.889] to convert the value to the content of aluminum oxide (% by weight).

Although the volume average particle diameter B of the titanium oxide filler is not specifically limited as long as the above-mentioned formula (II) is satisfied, it is preferably 0.01 to 10 µm, more preferably 0.1 to 1 µm, and further preferably 0.20 to 0.35 µm, from the viewpoints that a reflective board having higher reflectance can be obtained, and that the dispersing property of the titanium oxide filler in the reflective board is improved. As the volume average particle diameter of such titanium oxide filler, a suitable one can be used by taking the thickness of the objective reflective board into consideration, and a titanium oxide filler obtained by suitably pulverizing a massive filler or a filler having a large volume average particle diameter, and sieving the filler with a sieve or the like where necessary so as to have a preferable volume average particle diameter may also be used.

The volume average particle diameter as used herein is a particle diameter when the cumulative degree is 50% in a distribution curve which is obtained by observing the titanium oxide filler by a scanning electron microscope (SEM), analyzing the obtained SEM photograph by an image analyzer (e.g., LUZEX IIIU prepared by Nireco Corporation) to obtain the amounts of particles in the respective particle diameter sections of the primary particles (%), and cumulating the amounts based on volume.

A commercially available titanium oxide may be used as the titanium oxide filler as long as A and B satisfy the above-mentioned formulas (I) and (II). The present inventors have found that, among commercially available titanium oxides, "TIPAQUE CR-61" prepared by Ishihara Sangyo Kaisha Ltd., "D-2378" prepared by Sakai Chemical Industry Co., Ltd. and "JR-405" prepared by Tayca Corporation have A and B which satisfy the above-mentioned formulas (I) and (II) and can be used as the titanium oxide filler in the present invention. It is naturally possible to change the volume average particle diameter B of such commercially available titanium oxide filler by using a sieve or the like as long as the formulas (I) and (II) are satisfied.

<Resin Composition>

The resin composition of the present invention comprises the liquid crystal polyester and the titanium oxide filler as mentioned above, and the content of the titanium oxide filler in the resin composition can be suitably optimized according to the kind of the liquid crystal polyester used and the kind of the titanium oxide filler used, and is preferably 5 to 100 parts by weight, more preferably 10 to 90 parts by weight, and further more preferably 10 to 80 parts by weight with respect to 100 parts by weight of the liquid crystal polyester. When the range of the content of the titanium oxide filler in the liquid crystal polyester is within such range, the obtained reflective board has advantages that the obtained reflective board exhibits fine reflectance, finer heat resistance by which occurrence of abnormal appearance is sufficiently suppressed, and that the preparation of the reflective board becomes easier. When the content of the titanium oxide filler is too much, the mechanical property of the obtained reflective board may be deteriorated. When plural kinds of titanium oxide fillers are used, the total content thereof may be within the above-mentioned range with respect to the liquid crystal polyester. Alternatively, when plural kinds of liquid crystal polyesters are used, the content of the titanium oxide filler may be within the above-mentioned range with respect to 100 parts by weight of the total amount of the polyesters.

Furthermore, where necessary, the resin composition of the present invention may include a filler other than the titanium oxide filler (hereinafter referred to as "other filler"). In this case, the content of the other filler is preferably 5 to 100 parts by weight, more preferably 5 to 90 parts by weight with respect to 100 parts by weight of the liquid crystal polyester. When the content of the other filler is too much, the color tone and reflectance of the obtained reflective board are easily decreased. Furthermore, since the melting viscosity of the resin composition is increased and granulating property is easily deteriorated, the moldability and processing property tends to be deteriorated when the composition is molded into a small-sized reflective board. In addition, when the other filler is used, an inorganic filler is preferable.

The inorganic filler may be a fibrous filler, a plate-like filler or a granular filler. Examples of the fibrous filler may include glass fibers, PAN-type and pitch type carbon fibers, silicon carbide fibers, asbest fibers, plaster fibers, ceramic fibers, metal fibers such as stainless fibers, aluminum fibers and brass fibers, zirconia fibers, alumina fibers, silica fibers, aluminasilicate fibers, titanium oxide fibers, silicon carbide fibers, boron fibers, potassium titanate whisker, barium titanate whisker, calcium carbonate whisker, wollastonite whisker, aluminum boronate whisker, zinc oxide whisker, silicon nitride whisker, silicon carbide whisker and asbest. Examples of the plate-like filler may include smectites such as montmorillonite, beidellite, nontronite, saponite, hectorite, sauconite, stevensite, Na-type hectorite, Li-type hectorite and saponite; layered polysilicate salts such as kanemite and kenyaite;

micas such as phlogopite, muscovite, sericite, fluorine phlogopite, K-type tetrasilicon mica, Na-type tetrasilicon mica, Na-type taeniolite and Li-type taeniolite; white lead, talc, wollastonite, bentnite, kaolin, halloysite, kaolinite, vermiculite, chlorite, pyrophyllite, clay, zirconium phosphate, titanium phosphate, graphite, alumina, zeolite, magnesium hydroxide, aluminum hydroxide, zirconium oxide, boron nitride, iron oxide, calcium carbonate, calcium sulfate, barium sulfate and glass flake. Examples of the granular filler may include silica, ceramic beads, glass beads, hollow glass beads, carbon black, alumina, zeolite, magnesium hydroxide, aluminum hydroxide, magnesium oxide, zirconium oxide, boron nitride, silicon carbide, iron oxide, calcium carbonate, magnesium carbonate and calcium sulfate. Among these, fibrous fillers such as glass fibers, titanium oxide fibers and wollastonite whisker, and plate-like fillers such as talc and micas are preferable so as to impart practical mechanical strength to the reflective board without significantly decreasing the reflectance of the reflective board. In addition, in such inorganic fillers, a coupling agent such as silane-based and titanate-based coupling agents and other surface treating agent are used in some cases. However, the amount of the surface treating agent used is preferably small in view of suppression of decrease in color tone.

Furthermore, the resin composition may include a release improving agent such as a fluorine resin, a higher aliphatic acid ester compound and an aliphatic acid metal soap; an antioxidant; a heat stabilizer; a fluorescent brightner; a ultraviolet absorber; an antistatic agent; a surfactant and the like to the extent that the purpose of the present invention is not deteriorated. Furthermore, additives having an effect of an external lubricant such as a higher aliphatic acid, a higher aliphatic acid ester, a higher aliphatic acid metal salt and a fluorocarbon-based surfactant may be incorporated.

The resin composition of the present invention may be obtained by mixing the liquid crystal polyester, the titanium oxide filler, and the other filler or additive which is used where necessary, by using a Henschel mixer, a tumbler or the like, or may be obtained by melt-kneading the mixture using an extruder after mixing by such manner to palletize it. The resin composition obtained by pelletizing as above has fine operation property in molding described below, and the range of options of a preferable molding method can be extended according to the form of an objective part.

<Reflective Board>

The reflective board of the present invention can be obtained by molding the resin composition as mentioned above by various conventionally-used molding processes. As the molding process, an injection molding process, an injection compression molding process, an extrusion molding process and the like are preferable. Among these, injection molding is preferable, and a reflective board having a thin inner portion and a reflective board having a complex shape can be produced by injection molding. Specifically, injection molding is suitable for producing a small-sized reflective board having a thickness of a thin portion of 0.01 mm to 3.0 mm, preferably 0.02 to 2.0 mm, more preferably 0.05 to 1.0 mm. Furthermore, such injection molding is specifically advantageous for the preparation of a reflective board for which heat resistance is required. Moreover, when the liquid crystal polyester having a preferable flow temperature as mentioned above is used, a reflective board having fine heat resistance, a solder heat resistant temperature of 285° C. or more, can be produced by injection molding. The solder heat resistant temperature as used herein is a temperature which is obtained by a series of means comprising soaking a test piece of the reflective board in a solder bath heated to a predetermined temperature for 1 minute, and visually confirming that no deformation or blister (abnormal appearance in the form of bulging) occurred on the test piece after soaking, and is the maximum temperature at which deformation or blister does not occur when the temperature of the solder bath is changed variously.

The molding temperature for melt-injection in the injection molding and the like is preferably a temperature which is 10 to 60° C. higher than the flow temperature of the resin composition used for melt molding. When the molding temperature is too low, the flowability of the resin composition is extremely decreased, and deterioration of moldability property and decrease in the strength of the reflective board tend to be caused. Furthermore, when the molding temperature is too high, the liquid crystal polyester is significantly deteriorated, and the reflectance of the reflective board tends to be decreased. The flow temperature of the resin composition may be measured by subjecting the resin composition to a similar measurement method to that of the method for measuring the flow temperature of the liquid crystal polyester as mentioned above using a capillary rheometer. When the resin composition comprises the liquid crystal polyester, titanium oxide filler and inorganic filler, the flow temperature of the resin composition is almost the same as the flow temperature of the liquid crystal polyester used.

The reflective board of the present invention has extremely fine reflectance against light beam in a visible light region, specifically against blue light. Specifically, a reflective board having a reflectance against light beam at a wavelength of 460 nm of 75% or more can be produced. Furthermore, a reflective board having a reflectance of 80% or more can also be produced. The reflectance as used herein is obtained based on the method A for determining all light reflectance in JIS K7105-1981 (standard white board: barium sulfate).

The reflective board of the present invention can be suitably used for elements relating to light reflection, specifically visible light reflection in the fields of electricity, electronics, automobiles, machineries and the like. For example, it can be used as a lamp reflector for light source apparatuses such as halogen lamps and HIDs, and as a high-strength reflective board for light-emitting apparatuses and display apparatuses using a light-emitting element such as LEDs and organic ELs. Specifically, it can be suitably used as a reflective board for a light-emitting apparatus using an LED.

EXAMPLES

Hereinafter Examples of the present invention are shown. However, the present invention is not limited by these Examples.

(1) Reflectance

A diffuse reflectance against light beam at a wavelength of 460 nm was measured on the surface of a flat plate test piece of 64 mm×64 mm×1 mm by using an automatic recording spectrometer ("U-3500", prepared by Hitachi, Ltd.) according to the method A for determination of all light reflectance in JIS K7105-1981 (standard white board: barium sulfate). The diffuse reflectance is a relative value when the diffuse reflectance of a standard white board of barium sulfate is considered as 100%.

(2) Solder Heat Resistant Temperature

A mini dumbbell test piece according to 1 (½) of JIS K7113 was soaked in a solder bath heated to a predetermined temperature for 1 minute, and the presence or absence of deformation or blister of the test piece was confirmed. The predetermined temperature was then raised sequentially by 5°

C., and the maximum temperature at which no deformation or blister was observed was considered as a solder heat resistant temperature.

(3) Aluminum Oxide Content-Converting Value A of Aluminum Content

About 0.05 g to 0.1 g of a titanium oxide filler was collected and put on a platinum dish, 1 g of sodium carbonate and 0.5 g of boric acid were added thereto, and the mixture was subjected to alkali-fusion using a burner. Water and 10 ml of hydrochloric acid were then added, the mixture was dissolved under warming at 130 to 150° C., and the volume of the solution was fixed in a 50 ml measuring flask. The solution was diluted 50-fold, the amount of aluminum was measured by ICP-AES, and the amount of aluminum included in the titanium oxide filler (% by weight) was obtained from the amount of aluminum and the weight of the collected titanium oxide filler and converted to the content of aluminum oxide (% by weight).

As the titanium oxide filler, the followings were used. The notation in [ ] represents the method for preparing the titanium oxide in the titanium oxide filler.

"TIPAQUE CR-61" prepared by Ishihara Sangyo Kaisha Ltd.: [chlorine method], volume average particle diameter 0.21 μm (abbreviated as "CR-61" in Table 1)

"TIPAQUE CR-60" prepared by Ishihara Sangyo Kaisha Ltd.: [chlorine method], volume average particle diameter 0.21 μm (abbreviated as "CR-60" in Table 1)

"TIPAQUE CR-67" prepared by Ishihara Sangyo Kaisha Ltd.: [chlorine method], volume average particle diameter 0.21 (abbreviated as "CR-67" in Table 1)

"TIPAQUE CR-EL" prepared by Ishihara Sangyo Kaisha Ltd.: [chlorine method], volume average particle diameter 0.25 μm (abbreviated as "CR-EL" in Table 1)

"TIPAQUE CR-50" prepared by Ishihara Sangyo Kaisha Ltd.: [chlorine method], volume average particle diameter 0.25 μm (abbreviated as "CR-50" in Table 1)

"TIPAQUE CR-58" prepared by Ishihara Sangyo Kaisha Ltd.: [chlorine method], volume average particle diameter 0.28 μl (abbreviated as "CR-58" in Table 1)

"D-2378" prepared by Sakai Chemical Industry Co., Ltd.: [sulfuric acid method], volume average particle diameter 0.26 μm (abbreviated as "D-2378" in Table 1)

"JR-405" prepared by Tayca: [sulfuric acid method], volume average particle diameter 0.21 μm (abbreviated as "JR-405" in Table 1)

"JR-600E" prepared by Tayca: [sulfuric acid method], volume average particle diameter 0.27 μm (abbreviated as "JR-600E" in Table 1)

Preparation Example 1

Preparation of Liquid Crystal Polyester 994.5 g (7.2 mol) of parahydroxy benzoate, 446.9 g (2.4 mol) of 4,4'-dihydroxybiphenyl, 299.0 g (1.8 mol) of terephthalic acid, 99.7 g (0.6 mol) of isophthalic acid and 1347.6 g (13.2 mol) of acetic acid anhydride were charged into a reaction vessel equipped with a stirrer, a torque meter, a nitrogen gas introduction tube, a thermometer and a reflux cooler, and 0.2 g of 1-methylimidazole was added. The inside of the reaction vessel was sufficiently purged with nitrogen gas, the temperature was raised up to 150° C. under flow of nitrogen gas over 30 minutes, and reflux was performed for 1 hour while the temperature was maintained. Thereafter 0.9 g of 1-methylimidazole was added, and the temperature was raised up to 320° C. over 2 hours and 50 minutes while the acetic acid as a by-product and the unreacted acetic acid anhydride were distilled off, and the temperature was maintained at the same temperature until increase of torque was observed to give a prepolymer.

The obtained prepolymer was solidified by cooling it to room temperature and pulverized with a coarse grinder, and the temperature of the obtained powder was raised under nitrogen atmosphere from room temperature to 250° C. over 1 hour and from 250° C. to 285° C. over 5 hours, and the powder was retained at the same temperature for 3 hours to perform solid-phase polymerization. The liquid crystal polyester obtained after cooling had a flow temperature of 327° C.

Examples 1 to 3 and Comparative Examples 1 to 6

80 parts by weight of the titanium oxide filler shown in Table 1 and 20 parts by weight of glass fibers ("CS03JAPX-1" prepared by Asahi Fiber Glass Co., Ltd.) were incorporated into 100 parts by weight of the liquid crystal polyester obtained in Preparation Example 1, and the mixture was melt-kneaded by using a biaxial extruder ("PCM-30" prepared by Ikegai) to give a resin composition in the form of pellets. The pelletized resin composition was molded at 340° C. in an injection molding machine ("Type PS40E5ASE" prepared by Nissei Plastic Industrial Co., Ltd.) to give a flat plate test piece and a mini dumbbell test piece, and these were subjected to the measurements of reflectance and solder heat resistant temperature, respectively. The results are shown in Table 1. A mirror-like finished mold was used for molding into the flat plate test piece.

TABLE 1

| Examples | Titanium oxide filler | A (% by weight) | B (μm) | A/B² (% by weight/ μm²) | Reflectance (%) | Solder heat resistant temperature (° C.) |
|---|---|---|---|---|---|---|
| Example 1 | CR-61 | 0.9 | 0.21 | 20 | 83 | 295 |
| Example 2 | D-2378 | 0.4 | 0.26 | 6 | 82 | 285 |
| Example 3 | JR-405 | 0.6 | 0.21 | 14 | 82 | 300 |
| Comparative Example 1 | CR-60 | 2.5 | 0.21 | 57 | 83 | 280 |
| Comparative Example 2 | CR-67 | 3.7 | 0.21 | 84 | 77 | <250 |
| Comparative Example 3 | CR-EL | <0.1* | 0.25 | <1.6 | 74 | 285 |
| Comparative Example 4 | CR-50 | 2.1 | 0.25 | 34 | 80 | 280 |
| Comparative Example 5 | CR-58 | 3.5 | 0.28 | 45 | 85 | 275 |
| Comparative Example 6 | JR-600E | 3.8 | 0.27 | 52 | 77 | <250 |

(6) *Less than the minimum quantified value

The invention claimed is:

1. A resin composition comprising a liquid crystal polyester and a titanium oxide filler, wherein a value obtained by converting a content of aluminum in the titanium oxide filler to a content of aluminum oxide is A % by weight and a volume average particle diameter of the titanium oxide filler is B μm, wherein B is 0.20 to 0.35 vm, and wherein A and B satisfy the following formulas (I) and (II):

$$A \geq 0.1 \tag{I}$$

$$A/B^2 \leq 20 \tag{II}.$$

2. The resin composition according to claim 1, wherein the content of the titanium oxide filler is 5 to 100 parts by weight with respect to 100 parts by weight of the liquid crystal polyester.

3. The resin composition according to claim 1, further comprising an inorganic filler other than the titanium oxide filler.

4. A reflective board which is obtained by molding the resin composition according to claim 1.

5. The reflective board according to claim 4, wherein the board has a solder heat resistant temperature of 285° C. or more.

6. The reflective board according to claim 4, wherein the board has reflectance of 75% or more against light beam at a wavelength of 460 nm, the reflectance being obtained by the all light reflectance measurement method A in accordance with JIS K7105-1981 (standard white board: barium sulfate).

7. A light-emitting apparatus comprising the reflective board according to claim 4 and a light-emitting element.

8. The light-emitting apparatus according to claim 7, wherein the light-emitting element is an LED.

9. A reflective board which is obtained by injection-molding the resin composition according to claim 1.

* * * * *